United States Patent
Nishi et al.

(10) Patent No.: US 8,523,384 B2
(45) Date of Patent: Sep. 3, 2013

(54) LIGHT EMITTING DEVICE

(75) Inventors: Masami Nishi, Tokushima (JP); Atsushi Yamamoto, Tokushima (JP)

(73) Assignee: Nichia Corporation, Anan-Shi (JP)

(*) Notice: Subject to any disclaimer, the term of this patent is extended or adjusted under 35 U.S.C. 154(b) by 0 days.

(21) Appl. No.: 12/831,741

(22) Filed: Jul. 7, 2010

(65) Prior Publication Data

US 2010/0270906 A1   Oct. 28, 2010

Related U.S. Application Data

(62) Division of application No. 11/707,915, filed on Feb. 20, 2007, now Pat. No. 7,775,687.

(30) Foreign Application Priority Data

Feb. 20, 2006  (JP) ............................... P2006-041972
Mar. 1, 2006  (JP) ............................... P2006-054528

(51) Int. Cl.
*F21V 9/00* (2006.01)
*F21S 4/00* (2006.01)

(52) U.S. Cl.
USPC ........ 362/231; 362/249.02; 362/329; 257/98; 257/99; 257/100

(58) Field of Classification Search
USPC ............... 362/231, 249.02, 329; 257/98–100
See application file for complete search history.

(56) References Cited

U.S. PATENT DOCUMENTS

| 3,875,456 | A | 4/1975 | Kano et al. |
| 5,324,962 | A * | 6/1994 | Komoto et al. ............ 257/89 |
| 6,521,916 | B2 * | 2/2003 | Roberts et al. ............ 257/100 |
| 6,846,101 | B2 * | 1/2005 | Coushaine ............ 362/517 |
| 6,850,002 | B2 | 2/2005 | Rossner et al. |
| 7,048,412 | B2 * | 5/2006 | Martin et al. ............ 362/247 |
| 7,220,017 | B2 | 5/2007 | Lee et al. |
| 2004/0256706 | A1 | 12/2004 | Nakashima |
| 2006/0273337 | A1 * | 12/2006 | Han et al. ............ 257/98 |

FOREIGN PATENT DOCUMENTS

| JP | 62-99110 U | 6/1987 |
| JP | 62-186192 U | 11/1987 |
| JP | 2004-140327 A | 5/2004 |
| JP | 2004/140327 A | 5/2004 |
| JP | 2004-207043 A | 7/2004 |
| JP | 2005-44738 A | 2/2005 |
| JP | 2005-303289 A | 10/2005 |

* cited by examiner

*Primary Examiner* — Sean Gramling
(74) *Attorney, Agent, or Firm* — Birch, Stewart, Kolasch & Birch, LLP

(57) ABSTRACT

A light emitting device having a simple structure and high decorating characteristics is provided.
The light emitting device comprises an emission source for outputting lights having different colors from different emission parts; and a transmitting resin having a conically shaped reflection surface for reflecting lights output from each of the emission parts, and covering the light emitting source, wherein the emission source is provided so that one or more of the emission parts are located away from a central axis of the conical shape.

20 Claims, 15 Drawing Sheets

LIGHT EMITTING DEVICE

This application is a Divisional of application Ser. No. 11/707,915, filed on Feb. 20, 2007 now U.S. Pat. No. 7,775,687, the entire contents of which are hereby incorporated by reference and for which priority is claimed under 35 U.S.C. §120.

BACKGROUND OF THE INVENTION

1. Field of the Invention

The present invention relates to a light emitting device. More particularly, the present invention relates to a light emitting device having light emitting elements having different emission colors.

2. Description of the Related Art

As an illumination lump for decoration used for a Christmas tree and so forth, light emitting diode has become recently used widely instead of a light bulb.

As the illumination lump using a light emitting diode, for example, Japanese Unexamined Patent Publication (Kokai) No. 2004-207043, there has been disclosed an emission instrument comprising an emission part composed of light emitting diodes 2r, 2g, and 2b of red, green, and blue, and a control part of selecting one or two or more of the light emitting diode(s) and making it (them) emit the light(s) in order.

Moreover, in Japanese Unexamined Patent Publication (Kokai) No. 2004-140327, there has been disclosed an illumination in which a member insulating a light does not exist in a side of the light emitting element and thereby the light from the side surface is set to be visible.

Furthermore, in Japanese Unexamined Patent Publication (Kokai) No. 2004-140327, there has been disclosed an illumination lump in which phosphors having different emission colors are disposed around the light emitting element and thereby lights having emission colors that are different according to the visual directions are output.

However, in the illumination lamp disclosed in the Japanese. Unexamined Patent Publication (Kokai) No. 2004-140327, lights having different colors can radiate in a large range. However, there have been problems that sparkle and such are small and that the decorating characteristics are not sufficient.

Moreover, in the illumination lump disclosed in the Japanese Unexamined Patent Publication (Kokai) No. 2004-207043, there has been a problem that the control part is required and its structure is complex and cannot be inexpensively produced.

SUMMARY OF THE INVENTION

Accordingly, an object of the present invention is to provide a light emitting device having a simple structure and high decorating characteristics.

To achieve the above object, a light emitting device according to the present invention, comprising:

an emission source for outputting lights having different colors from different emission parts; and a transmitting resin having a conically shaped reflection surface for reflecting lights output from each of the emission parts, and covering the light emitting source; and wherein the emission source is provided so that one or more of the emission parts are located away from a central axis of the conical shape.

In the light emitting device according to the present invention, the emission source may have at least one light emitting element and a plurality of phosphor layers having different emission colors that are provided on an upper portion of the light emitting element and thereby, each of the emission parts may be formed so as to correspond to each of the phosphor layers.

In the light emitting device according to the present invention, the light emitting source may comprise a plurality of light emitting elements having different emission colors.

In the light emitting device according to the present invention, the conical shape may be a polygonal cone or may be a circular cone.

In the light emitting device according to the present invention, in the case that the conical shape is a polygonal cone, each of the emission parts may be disposed so as to face to the boundary part of two adjacent surfaces forming the polygonal cone or so as to face to each of the surfaces forming the polygonal cone.

The outer shape of the transmitting resin may be a polygonal prism shape or may be a cylindrical shape.

Moreover, it is preferable that a central axis of an outer shape of the transmitting resin accords with a central axis of the conical shape.

In the light emitting device according to the present invention, it is preferable that all of the emission parts are located away from the central axis of the conical shape.

In the light emitting device according to the present invention formed as described above, at least one of the emission parts are disposed away from a central axis of the conical shape and therefore, lights output from the respective emission parts are reflected in the different direction.

Therefore, according to the present invention, the light emitting device having a simple structure and high decorating characteristics can be provided.

DETAILED DESCRIPTION OF THE INVENTION

Figure 1:
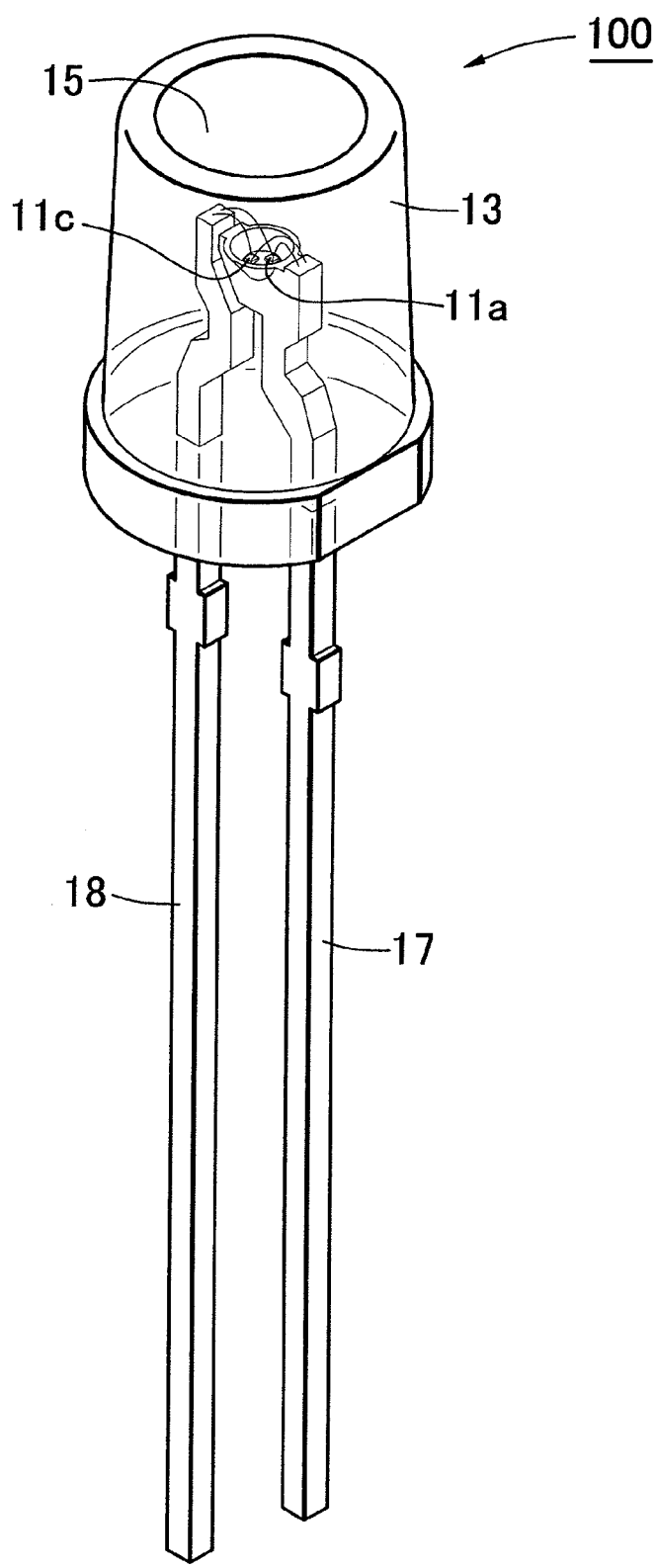
FIG. 1A is a perspective view showing a structure of a light emitting device 100 of the first embodiment according to the present invention.
FIG. 1B is a section view of FIG. 1A.
Figure 1:
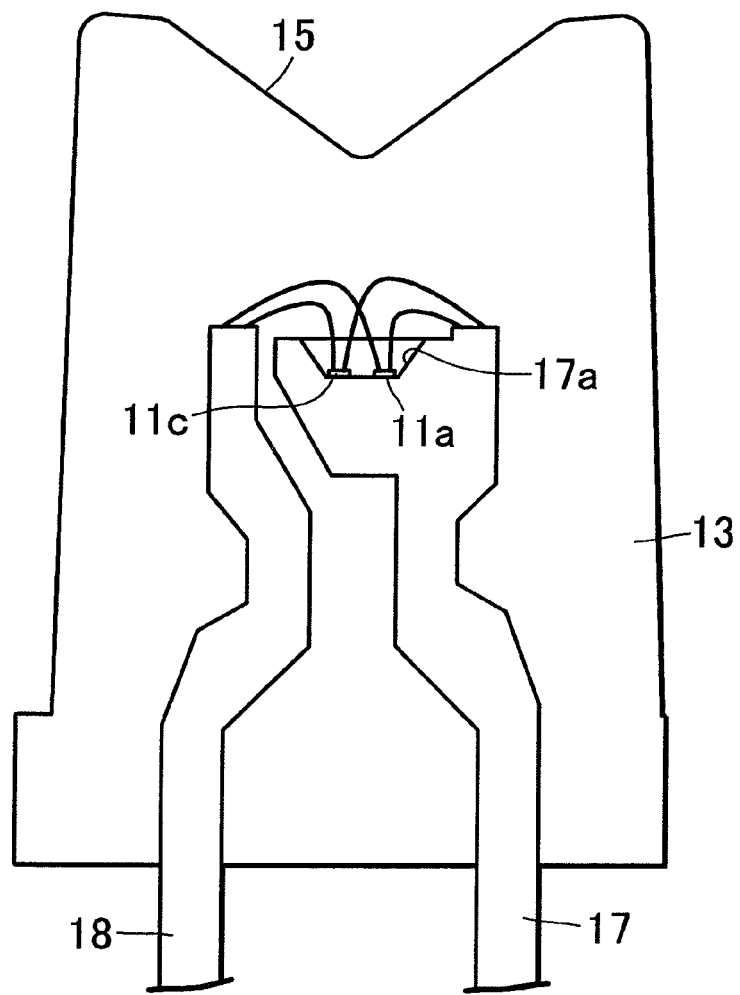

Hereinafter, the light emitting device of an embodiment according to the present invention will be described with reference to the accompanying drawings.

First Embodiment

FIG. 1A is a perspective view showing a structure of a light emitting device 100 of the first embodiment according to the present invention. FIG. 1B is a section view thereof.

The light emitting device of this the first embodiment comprises, light emitting elements 11a, 11c, a cup 17a that the light emitting elements 11a, 11c are provided on an end of, a lead 17 to which one electrode of the light emitting elements 11a, 11c, a lead 18 to which the other electrode of the light emitting elements 11a, 11c, and a transmitting resin 13 covering the light emitting elements 11a, 11c and end parts of the leads 17, 18.

Here, in particular, the light emitting device of the present first embodiment is characterized in that a conically shaped reflection surface 15 is provided on an upper surface of the transmitting resin 13, and the light emitting elements 11a, 11c are provided at separate positions from the central axis of the conically shaped reflection surface 15 in the cup 17a.

In addition, in the present specification, the simply referred central axis represents the central axis of the reflection surface 15 as long as not being particularly declared.

Moreover, in the light emitting device of the first embodiment, as a more preferable embodiment, the light emitting elements 11a, 11c are disposed in the both sides of the central axis.

In the light emitting device of the first embodiment constituted as described above, the light emitting elements 11a, 11c are disposed away from the central axis of the reflection surface 15 and therefore, lights output from the light emitting elements 11a, 11c are input with being inclined to one side of the reflection surface 15 respectively, and the respective lights are reflected in the different direction corresponding to plane directions of incident positions in the reflection surface.

In particular, in the present first embodiment, the light emitting elements 11a, 11c are disposed symmetrically with respect to the central axis and therefore, a light output from the one light emitting element 11a is reflected in one side of the reflection surface 15 and output, and a light output from one light emitting element 11c is reflected in the opposite side to the reflection surface 15 and output.

Accordingly, in the light emitting device of the present first embodiment, a light of the light emitting element 11a can be observed in one direction, and a light of the light emitting element 11c can be observed in the opposite direction.

Moreover, in the light emitting device of the first embodiment, the intensities of lights input to the reflection surface 15 are different according to distance or direction from the light emitting element 11a or 11c to the reflection surface 15 and therefore, the intensities of lights are seen to be different according to the visual direction or angle.

From this, according to the light emitting device of the present first embodiment, a light emitting device having excellent decorating characteristics as a light source for illumination can be provided.

Each member of the light emitting device of the present first embodiment will now be described in more detail below.

(Light Emitting Element)

The light emitting element used herein comprises a semiconductor layer of GaAlN, ZnO, ZnS, ZnSe, SiC, GaP, GaAlAs, AlN, InN, AlInGaP, InGaN, GaN, AlInGaN, and the like formed as the light emitting layer.

(Light Transmitting Resin)

Figure 2:
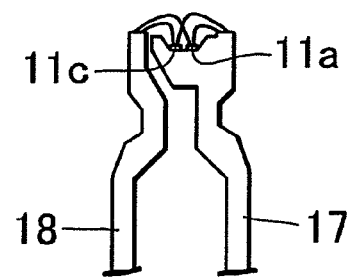
FIG. 2A is a section view of a first step in a production process of the first embodiment.
FIG. 2B is a section view of a second step in a production process of the first embodiment.
FIG. 2C is a section view of a third step in a production process of the first embodiment.
FIG. 2D is a section view of a fourth step in a production process of the first embodiment.
FIG. 2E is a section view of the light emitting device accomplished by a production process of the first embodiment.
Figure 2:
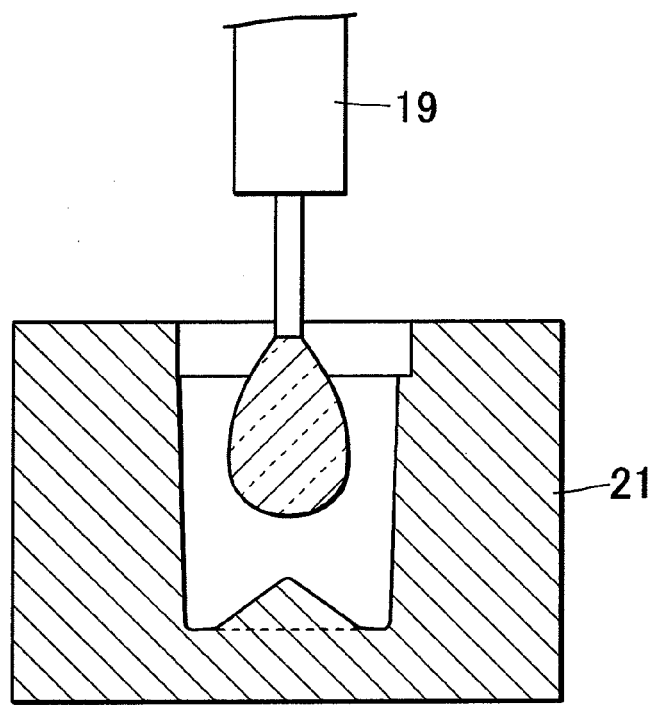
Figure 2:
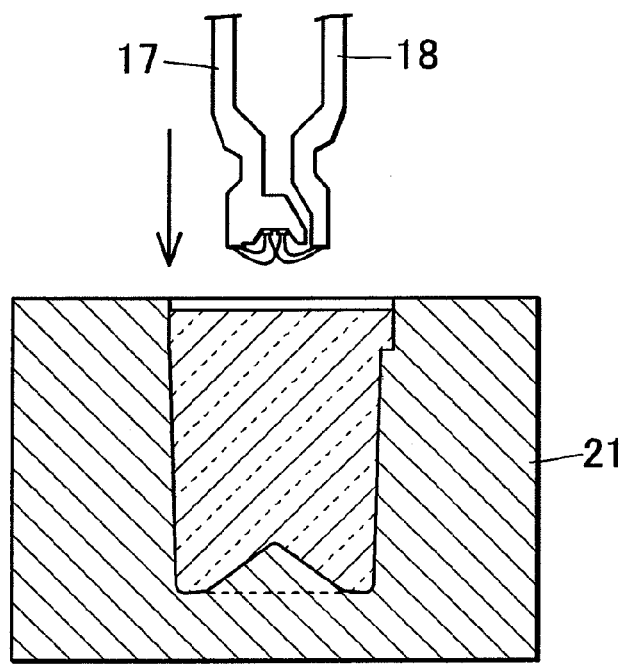
Figure 2:
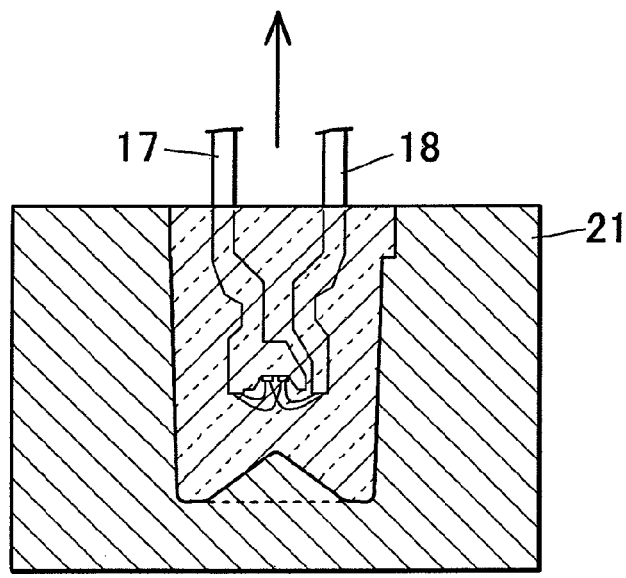
Figure 2:
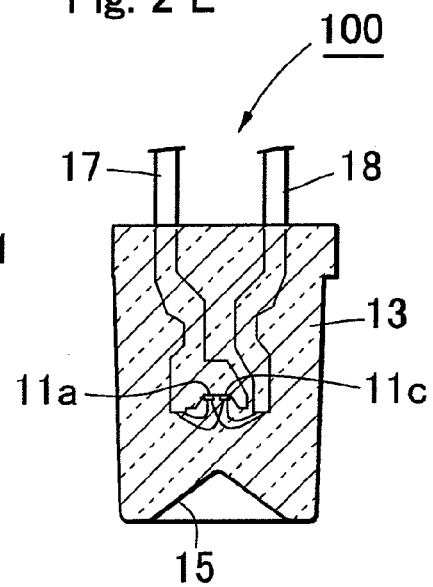
Figure 3:
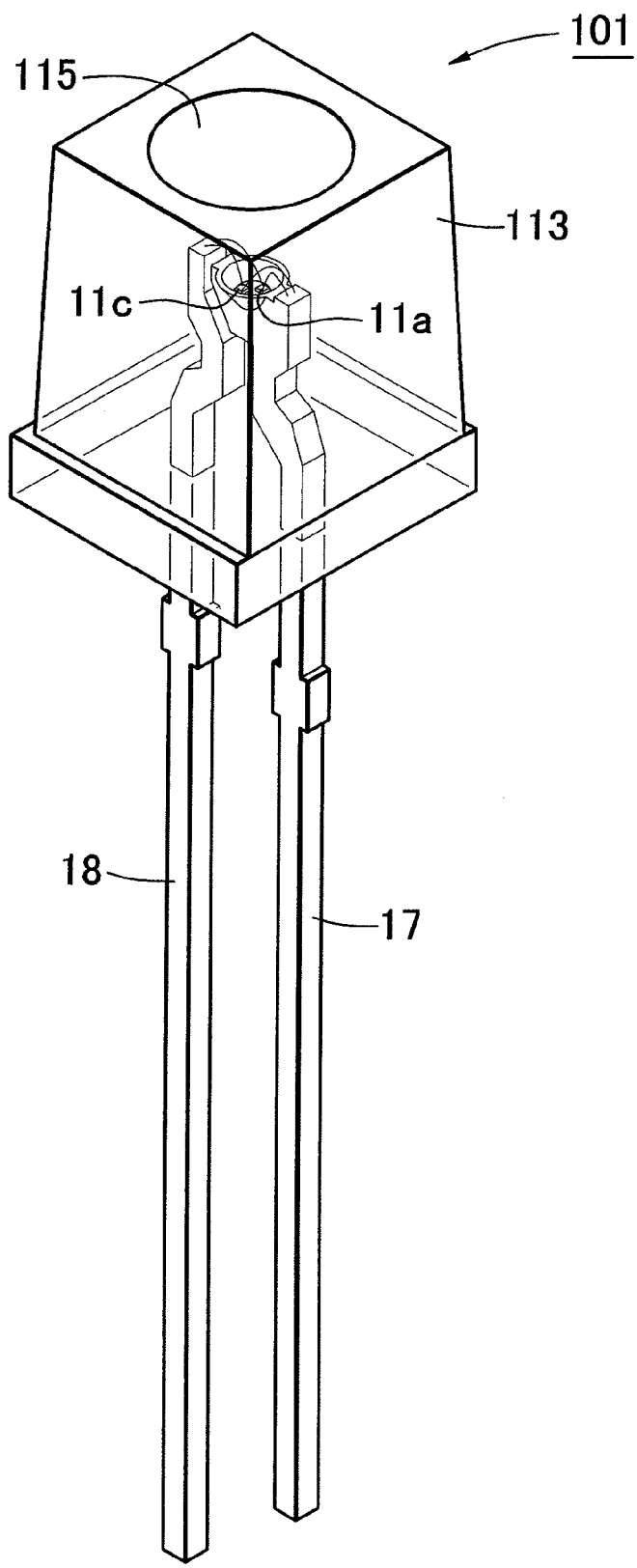
FIG. 3 is a perspective view of the light emitting device of Modified Example 1 according to the present invention.
Figure 4:
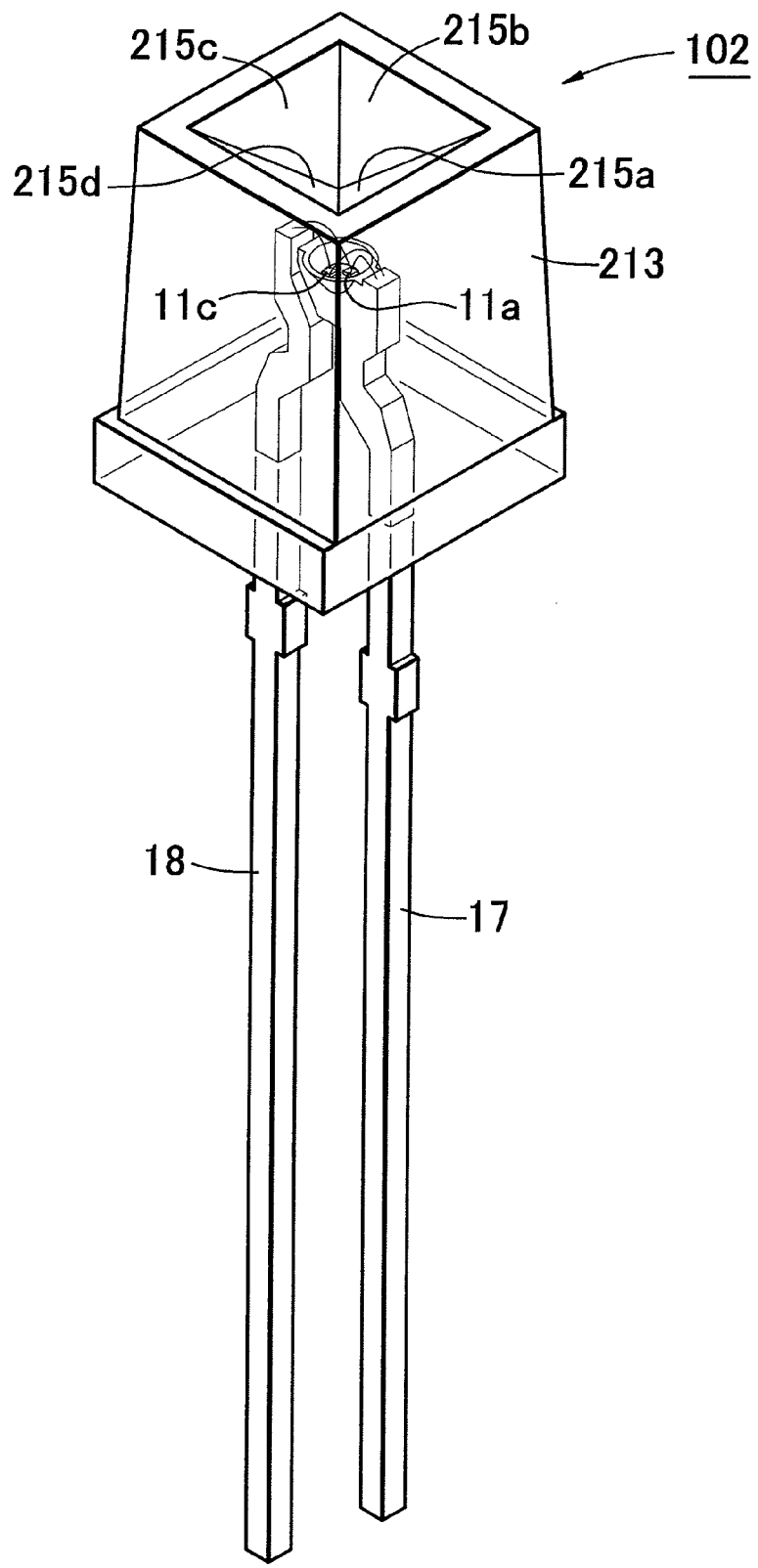
FIG. 4 is a perspective view of the light emitting device of Modified Example 2 according to the present invention.
Figure 5:
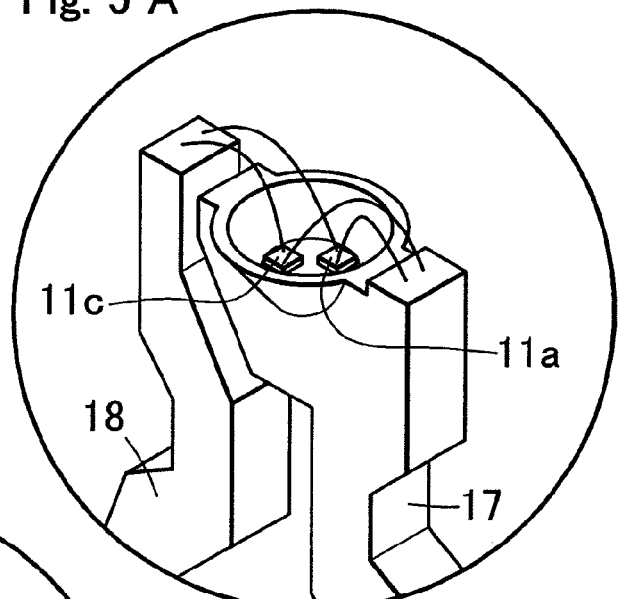
FIG. 5A is a perspective view showing the light emitting elements in the light emitting device of the first embodiment and a structure of their circumstance.
FIG. 5B is a perspective view showing the light emitting elements in the light emitting device of Modified Example 3 according to the present invention and a structure of their circumstance.
FIG. 5C is a perspective view showing the light emitting elements in the light emitting device of Modified Example 4 according to the present invention and a structure of their circumstance.
FIG. 5D is a perspective view showing the light emitting elements in the light emitting device of Modified Example 5 according to the present invention and a structure of their circumstance.
FIG. 5E is a perspective view showing the light emitting elements in the light emitting device of Modified Example 6 according to the present invention and a structure of their circumstance.
Figure 5:
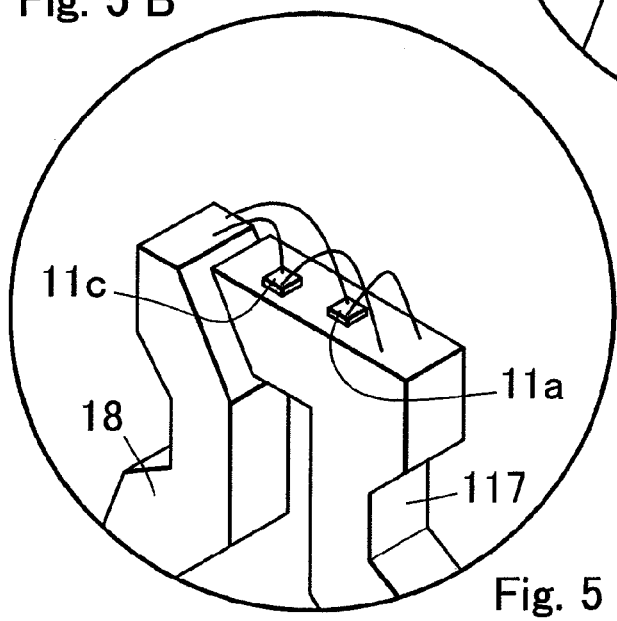
Figure 5:
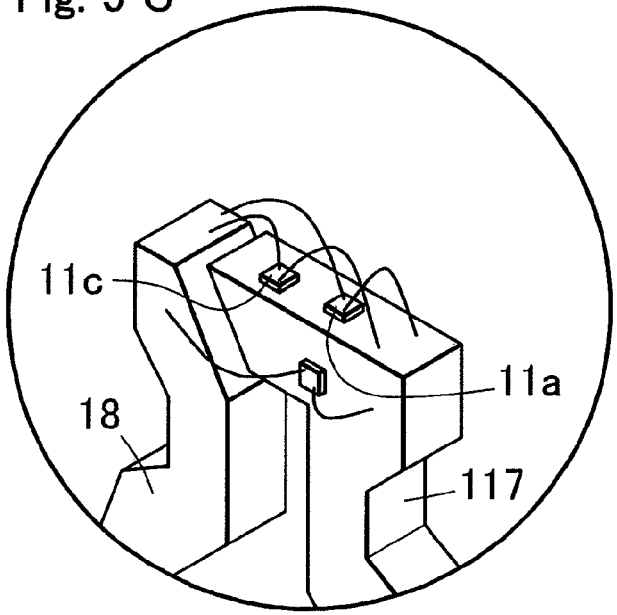
Figure 5:
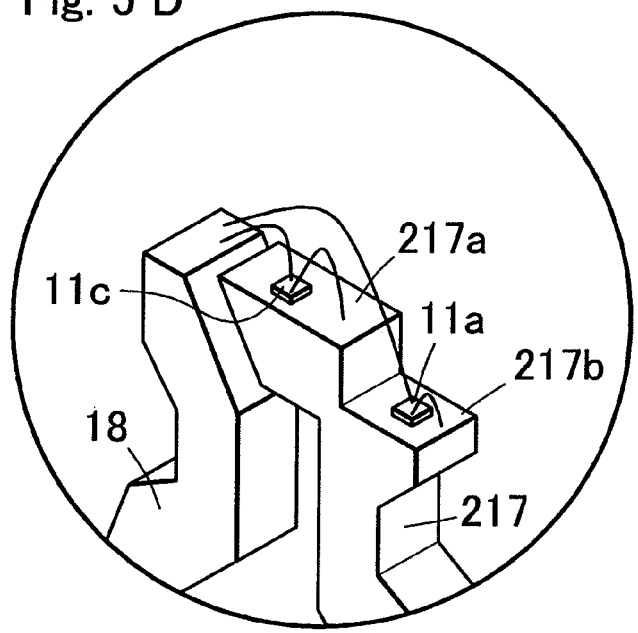
Figure 5:
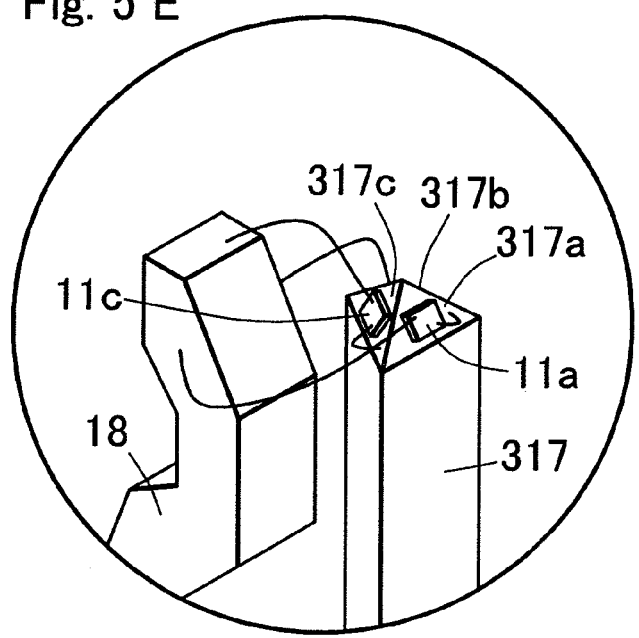

Shape of the light transmitting resin may be any one of column-shaped as shown in FIG. 1, quadratic prism-shaped as shown in FIGS. 2 and 3, or triangular prism-shaped as shown in FIG. 4. Shape of the reflection surface formed on an upper surface of the light transmitting resin may be either a cone-shaped recess as shown in FIGS. 1, 2, and 5, or a pyramid-shaped column as shown in FIGS. 3 and 4.

Examples of the light transmitting resin include an epoxy resin, a silicone resin, an acrylic resin, a polycarbonate resin, an amorphous polyolefin resin, a polystyrene resin, a norbornene-based resin, and a cycloolefin polymer (COP) are given and selected accordance with an use.

An epoxy resin is preferable because it is tack free, adhesion of dust can be disrupted. A silicone resin is hardly deteriorated by light, so that it is more preferable for a high output power light emitting device. Moreover, an acrylic resin has high transparency so that yellowing due to deterioration by light hardly occurs. Therefore, deterioration in output with time hardly occur and thus suitably used in the present invention. A polycarbonate resin has excellent impact resistance.

(Lead)

The lead is composed of at least two leads, and a light emitting element is mounted onto at least one of them. The end of the lead may be a cup-shaped defining a recess formed therein, or may be a plane-shaped. Further, the mounting position of the light emitting element is not limited to the end of the lead, and it may be a side surface thereof. Further, a step may be formed on an end of the lead, so that two or more light emitting elements can be mounted using the step.

Further, it is possible to employ a polyhedral shape having two or more mounting positions that have different angles.

A good electric conductive material such as copper, phosphor bronze, iron, and nickel can be used for the lead. Further, a noble metal plating using silver, gold, palladium, rhodium and the like can be applied to the surface of such good electric conductive materials.

(Reflection-Enhancing Member)

A reflection-enhancing member is formed on a reflection surface. When the reflection surface is a cone-shaped or pyramid-shaped recess, the reflection-enhancing member may be formed as a film on the inside surface of the recess, or formed so as to fill the cone-shaped or pyramid-shaped recess. Moreover, the reflection-enhancing member may also be formed either on the entire surface or a part of the surface of the cone-shaped or pyramid-shaped recess. When the reflection-enhancing member is formed partially thereon, it is preferable to form it on the lowest part of the cone-shaped or pyramid-shaped recess.

Examples of the material for the reflection-enhancing member include metals such as Ag, Al, Ni, Au, and Cu, white-color members, or metal oxide films such as $SiO_2/ZrO_2$ and $SiO_2/TiO_2$. Further, after forming a metal oxide film, a metal member or a white member such as $SiO_2/Ti$ and $SiO_2$/white member may also be formed.

The reflectance of a metal member and the reflectance of a white member are independent from the wavelength from the light emitting element. Therefore, when either a metal member or a white member is used, the film thickness thereof is not needed to be controlled. Therefore, a minimum thickness that is sufficient to prevent light from transmitting is needed. Ag having a high reflectance or Al having a high durability is preferably used.

As for the white member, a white coating material (for example, barium sulfate), a white plating (for example, white alumite), and a white sheet (for example, polypropylene) are suitably used. When a metal oxide film is used, relationship between the wavelength and film thickness needs to be considered. Pairs of oxide films having alternate high refractive index and low refractive index are stacked to form an oxide film. Relationship between the thickness (d) and the wavelength ($\lambda$) is needed to satisfy the formula $\lambda=4nd$. When two or more different wavelengths are emitted from the light emitting element, all the light is needed to be reflected. In this case, two kinds of methods may be used, one is forming a reflection-enhancing member capable of exerting a mirror effect in a wide wavelength range, and another is forming a mirror corresponding to each wavelength.

The reflection-enhancing member that exerts a mirror effect through a wider wavelength range may be realized by widening the difference of refractive index between the oxide films in the pair.

A mirror corresponding to each wavelength can be realized by, for example, alternately stacking reflecting films that are adjusted to 400 nm condition and to 500 nm condition in series configuration, so as to reflect both a light of 400 nm and a light of 500 nm. This is because a light is permeable to a film unsuited to its reflecting condition.

Hereinafter, a method of the light emitting device of the present first embodiment will be described.

In the present method, first, the lead 17 and the lead 18 are held with, for example, a jig so that a predetermined relation of their positions is held.

Next, the light emitting elements 11*a*, 11*c* are fixed to predetermined positions on a bottom surface of the cup 17*a* of the lead 17 by die bonding, and predetermined lines are provided (FIG. 2A).

The fixation of the light emitting elements 11*a*, 11*c* into the cup is performed by, for example, a method of implementation with a curing resin or a method of implementation with a eutectic metal, and particularly, is not limited.

In addition, in the case of implementing the light emitting elements with a eutectic metal, a eutectic metal is formed on back surfaces of the light emitting elements by sputtering or like, and thereby the cup 17*a* of the lead On the other hand, in a mold 21 in which a conically-shaped convex portion corresponding to its bottom so that a conically shaped concave portion to be a reflection surface is formed, for example, a heat-curable transmitting resin is filled up by, for example, a dispenser 19 and so forth (FIG. 2B).

Then, the lead 17 in which the light emitting elements 11*a*, 11*c* are implemented on the bottom surface of the cup 17*a* and the lead 18 are inserted into the transmitting resin filled up in the mold 21 along with holding the relation of their positions (FIG. 2C and FIG. 2D) and the resin is cured and then taken out of the mold 21 (FIG. 2E).

Last, a reflection film is formed on the concave portion formed with respect to the convex portion of the mold 21 in the upper surface of the transmitting resin 13 and thereby, the light emitting device of the present first embodiment is accomplished.

Hereinafter, modified examples according to the present invention will be described.

Modified Example 1

FIG. 3 is a perspective view of a light emitting device 101 of a modified example 1 according to the present invention.

In the light emitting device 101 of the modified example 1, an outer shape of a transmitting resin 113 is an approximately quadrangular prism. Accurately, the shape is a quadrangular frustum and is provided with a taper in which the upper surface on which a reflection surface 115 is formed is slightly small.

In Modified Example 1, the structures except for the outer shape of the transmitting resin 113 are the same as the first embodiment. Its production method is the same as the first embodiment.

The light emitting device 101 of Modified Example 1 is constituted as described above and the outer shape of the transmitting resin 113 is an approximately quadrangular prism and therefore, lights are scattered at their angular parts and emission colors are more complexly changed according to the visual direction.

Modified Example 2

FIG. 4 is a perspective view of a light emitting device 102 of Modified Example 2 according to the present invention.

In the light emitting device 102 of the Modified Example 2, the outer shape of a transmitting resin 213 is an approximately quadrangular prism and a reflection surface 215 is formed in a quadrangular-pyramid shape and composed of four reflection surfaces 215a, 215b, 215c, and 215d that have different directions. In addition, the outer surfaces of the transmitting resin 213 having an approximately quadrangular prism shape are composed of four surfaces 213a, 213b, 213c, and 213d that have different directions.

In Modified Example 2, the structures except for the outer shape of the transmitting resin 213 and for the shape of the reflection surfaces are the same as the first embodiment and its production method is the same as the first embodiment.

The light emitting device 102 of Modified Example 2 is constituted as described above and the outer shape of the transmitting resin 213 is an approximately quadrangular prism and the shape of the reflection surfaces is a quadrangular pyramid and therefore, lights are scattered at corners of outer surfaces of the transmitting resin 213 and at angular parts of the reflection surfaces and emission colors are more complexly changed according to the visual direction.

Moreover, in the present invention, also with respect to dispositions of the light emitting elements 11a, 11c, various modifications are possible. In addition, in the following Modified Examples 3 to 6, every one of the transmitting resin shape of the first embodiment, the transmitting resin shape of Modified Example 1, and the transmitting resin shape of Modified Example 2, is possible.

Modified Example 3

In the light emitting device of Modified Example 3, as shown in FIG. 5B, a lead 117 in which a cup part is not provided on the mounting surface of the light emitting elements and the mounting surface is set to be flat is used and thereby, the light emitting elements 11a, 11c are implemented on the flat surface.

By the above described method, lights reflected at the reflection surfaces and lights output from the side surface of the light emitting elements can be output directly outside.

Modified Example 4

Moreover, in a light emitting device of Modified Example 4, as shown in FIG. 5C, a lead 117 in which a cup part is not provided on the mounting surface of the light emitting elements and the mounting surface is set to be flat is used and, in the light emitting device of the modified example 3, a third light emitting element 11b is provided at a side surface of the lead 117.

By the above described method, lights can be radiated from the third light emitting element 11b, and lights having emission colors that are more complexly changed can be obtained.

Modified Example 5

Moreover, in a light emitting device of Modified Example 5, as shown in FIG. 5D, the light emitting elements is provided by using a lead 217 provided with a step on its mounting surface is used.

By the above described method, for example, a light of the light emitting element 11a provided on a surface of 217b is blocked by a surface 217a that is higher by one step and therefore, difference of emission colors according to the visual direction becomes clearer.

Moreover, realization of the light emitting device having high decorating characteristics by reflection generated by a side surface of the step becomes possible.

Modified Example 6

Furthermore, in the light emitting device of Modified Example 6, as shown in FIG. 5E, a lead 317 whose mounting surfaces of the light emitting elements is set to have a triangular shape is used and, the light emitting element is provided on each of three surfaces 317a, 317b, and 317c of the triangular conical shape.

By the above described method, lights output from the light emitting elements 11a, 11b, and 11c can be output in different directions and the difference of the emission colors according to the visual direction becomes clearer.

Moreover, by controlling the angle of the mounting surfaces, the colors can also be mixed at a discretionary percentage. In addition, the mounting surfaces that are on a convex portion having a triangular conical shape are shown. However, the mounting surfaces are not limited thereto, and may be a polyangular conical shape such as a quadrangular conical shape. Furthermore, the mounting surfaces may have a concave portion having a conical shape as well as a convex shape.

Second Embodiment

Figure 6:
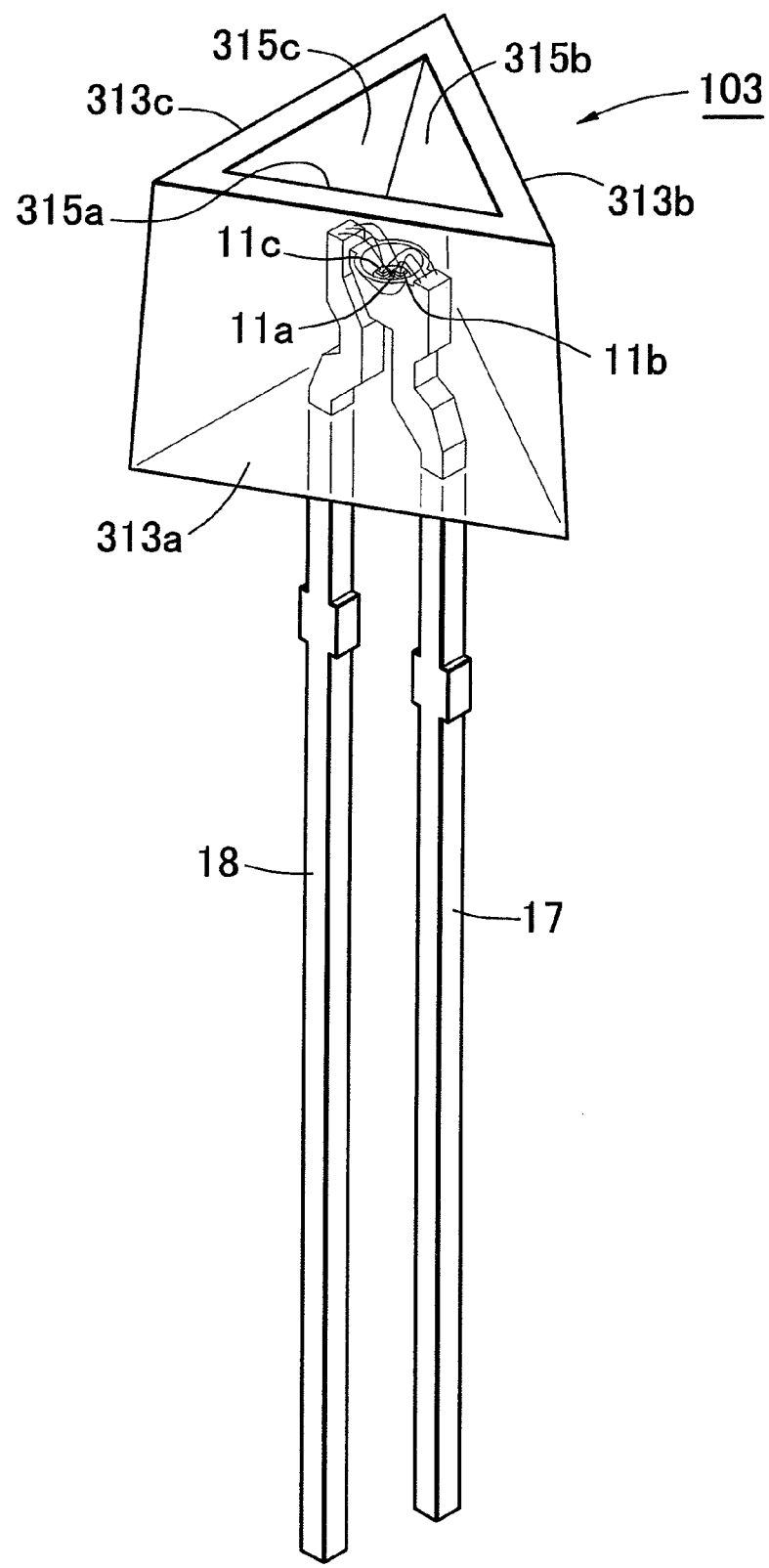
FIG. 6A is a perspective view showing a structure of the light emitting device of the second embodiment according to the present invention.
FIG. 6B is a plan view showing schematically the relation of positions of light emitting elements with respect to reflection surfaces in the light emitting device of the second embodiment.
FIG. 6C is a plan view showing schematically the relation of positions of light emitting elements with respect to reflection surfaces in the light emitting device according to Modified Example of the second embodiment.
Figure 6:
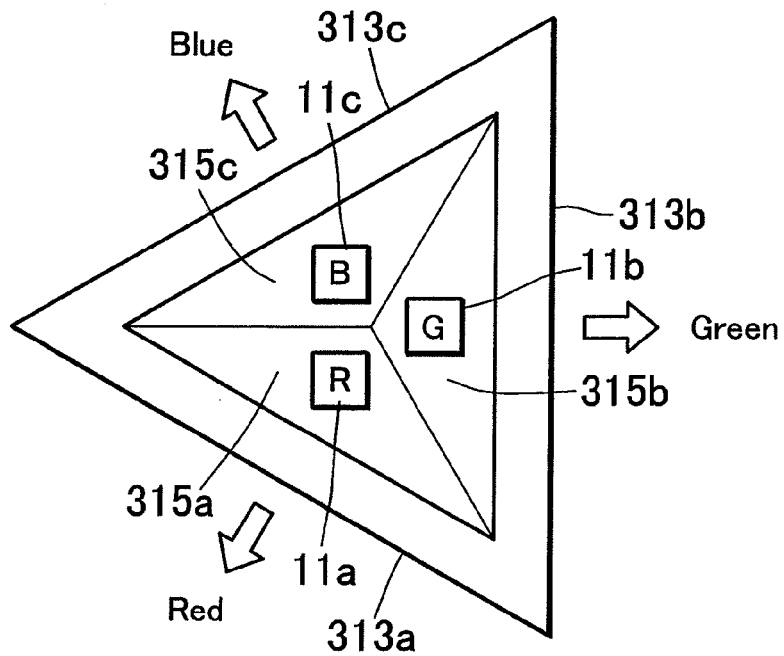
Figure 6:
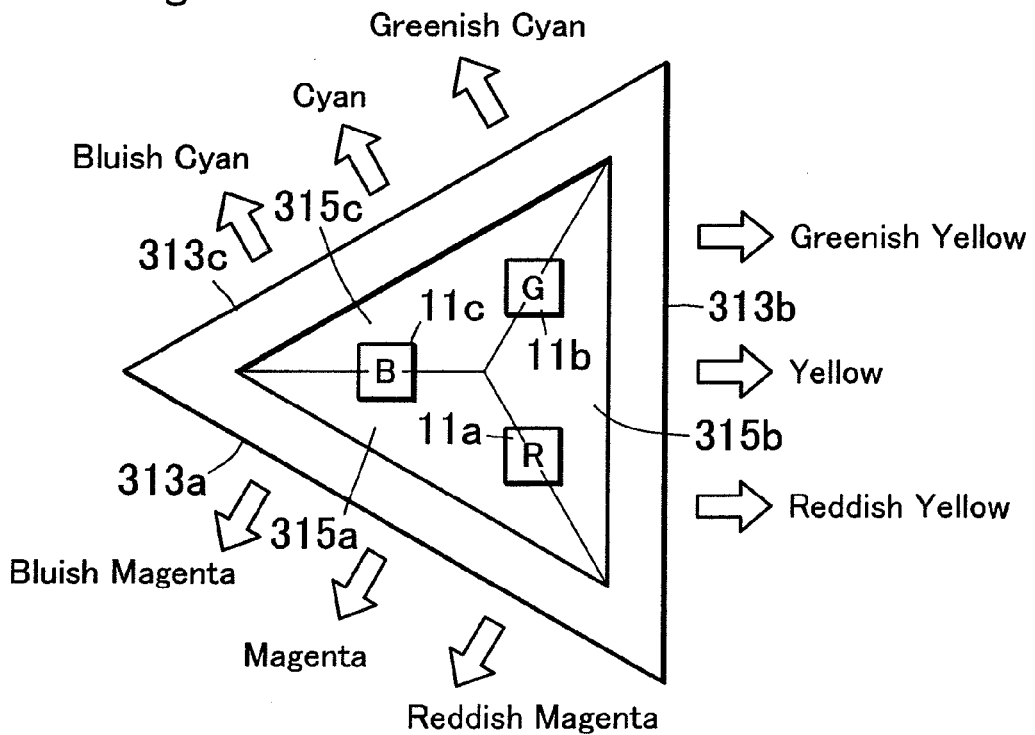

As shown in FIG. 6A, a light emitting device 103 of the second embodiment according to the present invention is different from that of the first embodiment at the points that (1) three light emitting elements 11a, 11b, and 11c are triangularly disposed in the cup 17a of the lead 17 of the first embodiment and (2) reflection surfaces 313 having a triangular conical shape are formed in a transmitting resin and its outer shape is set to a triangular prism.

In addition, in the light emitting device 103 of the present second embodiment, as shown in FIG. 6B, each of light emitting elements 11a, 11b, and 11c is disposed so as to face to each of three reflection surfaces 315a, 315b, and 315c that constitute the reflection surface 315 and that have different plane directions. Here, for example, the light emitting element 11a is a red light emitting element, and the light emitting element 11b is a green light emitting element, and the light emitting element 11c is a blue light emitting element.

In the light emitting device 103 of the second embodiment constituted as described above, a red light to be output from the red light emitting element 11a is reflected at the opposed reflection surface 315a, and a green light to be output from the green light emitting element 11b is reflected at the opposed reflection surface 315b, and a blue light to be output from the blue light emitting element 11a is reflected at the opposed reflection surface 315c, and the lights are output mainly from the outer surfaces 313a, 313b, and 313c, respectively.

By the light emitting element 103 of the second embodiment constituted as described above, lights having different colors to be output from the light emitting elements 11a, 11b, and 11c can be output and difference of emission colors according to the visual direction becomes clearer.

Moreover, by the emission device 103 of the present second embodiment, emission colors are complexly changed in angles by the reflection surfaces and angles by outer surfaces and thereby, decorating property can be more improved.

Modified Example 7

In the light emitting device 103 of the second embodiment, each of light emitting elements 11a, 11b, and 11c is disposed so as to face to each of three reflection surfaces 315a, 315b, and 315c, and a red light to be output from the red light emitting element 11a is reflected at the opposed reflection surface 315a, and a green light to be output from the green light emitting element 11b is reflected at the opposed reflection surface 315b, and a blue light to be output from the blue light emitting element 11a is reflected at the opposed reflection surface 315c. In Modified Example 7, the light emitting elements 11a, 11b, and 11c are disposed as follows.

That is, in the Modified Example 7, as shown in FIG. 6C, the red light emitting element 11a is disposed so as to face to a boundary part between the reflection surface 315a and the reflection surface 315b, and the green light emitting element 11b is disposed so as to face to a boundary part between the reflection surface 315b and the reflection surface 315c, the blue light emitting element 11c is disposed so as to face to a boundary part between the reflection surface 315c and the reflection surface 315a.

By the above described method, a light output from the red light emitting element 11a separates and enters the reflection surface 315a and the reflection surface 315b and is reflected by the respective reflection surfaces 315a, 315b.

A light output from the green light emitting element 11b separates and enters the reflection surface 315b and the reflection surface 315c and is reflected by the respective reflection surfaces 315b, 315c. A light output from the blue light emitting element 11c separates and enters the reflection surface 315c and the reflection surface 315a and is reflected by the respective reflection surfaces 315c, 315a.

Accordingly, in the present Modified Example 7, in the reflection surface 315a, the red light output from the red light emitting element 11a and the blue light output from the blue light emitting element 11c are input and, a light having a color of its color-mixed degree according to their positions is output as the reflected light. For example, as shown in FIG. 6C, a purple light partaking of red is output in the side near the red light emitting element 11a, and a purple light partaking of blue is output in the side near the blue light emitting element 11c, and a medial purple light is output in the central part.

Moreover in the reflection surface 315b, the red light output from the red light emitting element 11a and the green light output from the green light emitting element 11b are input and, a light having a color of its color-mixed degree according to their positions is output as the reflected light. For example, as shown in FIG. 6C, a yellow light partaking of red is output in the side near the red light emitting element 11a, and a yellow light partaking of green is output in the side near the green light emitting element 11b, and a medial yellow light is output in the central part.

Furthermore, in the reflection surface 315c, the blue light output from the blue light emitting element 11c and the green light output from the green light emitting element 11b are input and, a light having a color of its color-mixed degree according to their positions is output as the reflected light. For example, as shown in FIG. 6C, a cyan light partaking of blue is output in the side near the blue light emitting element 11c, and a cyan light partaking of green is output in the side near the green light emitting element 11b, and a medial cyan light is output in the central part.

As described above, in the light emitting device of the present example 7, a light emitting device by which lights having various colors that are different according to the visual direction can be output.

Third Embodiment

The light emitting device of the third embodiment according to the present invention has a different structure of the emission source in the cup 17a of the lead 17 from that of the light emitting device of the first embodiment. The other parts are the same with the first embodiment. That is, in the first embodiment, different emission parts are constituted by using a plurality of light emitting elements having different emission colors as the emission source. However, in the present third embodiment, as shown in FIG. 7, one light emitting element 11a is used and thereon, a plurality of phosphor layers having different emission colors are formed and thereby, a plurality of emission parts having different emission colors.

Figure 7:
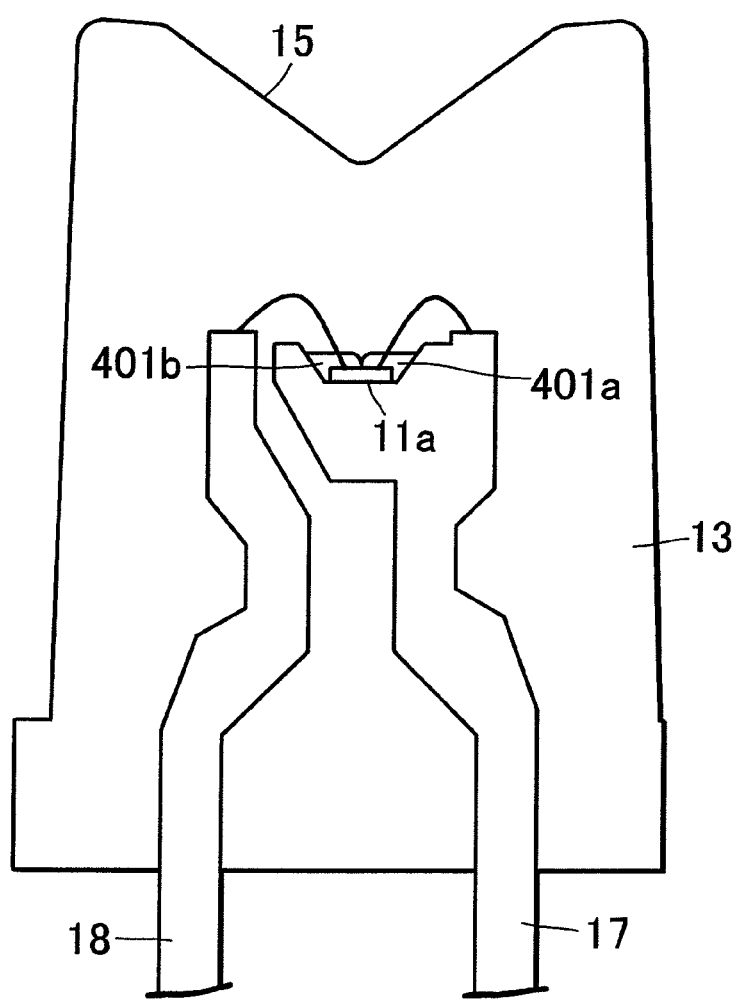
FIG. 7 is a section view showing a structure of a light emitting device of the third embodiment according to the present invention.
Figure 9:
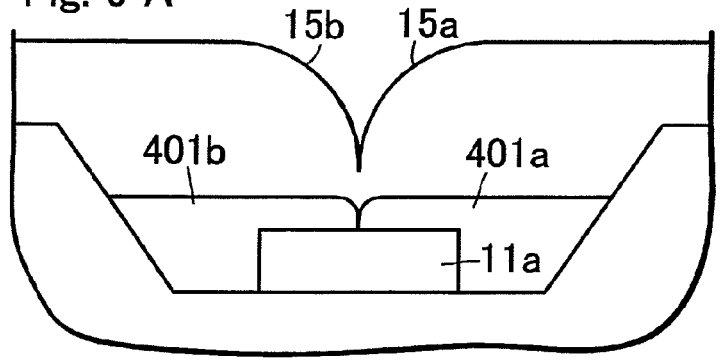
FIG. 9A is a section view showing the light emitting elements in the light emitting device of the third embodiment and a structure of their circumstance.
FIG. 9B is a section view showing the light emitting elements in the light emitting device of Modified Example 8 according to the present invention and a structure of their circumstance.
FIG. 9C is a section view showing the light emitting elements in the light emitting device of Modified Example 9 according to the present invention and a structure of their circumstance.
FIG. 9D is a section view showing the light emitting elements in the light emitting device of Modified Example 10 according to the present invention and a structure of their circumstance.
Figure 9:
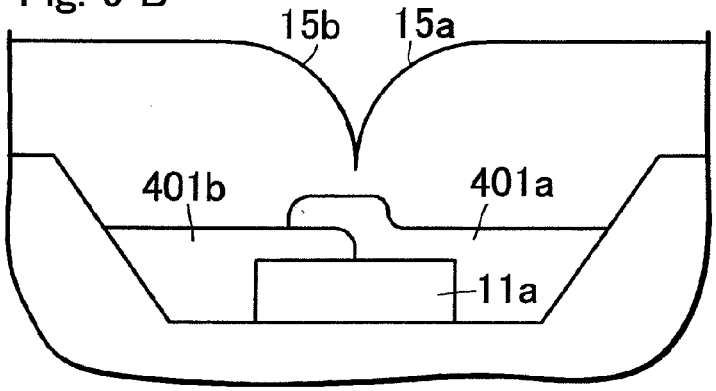
Figure 9:
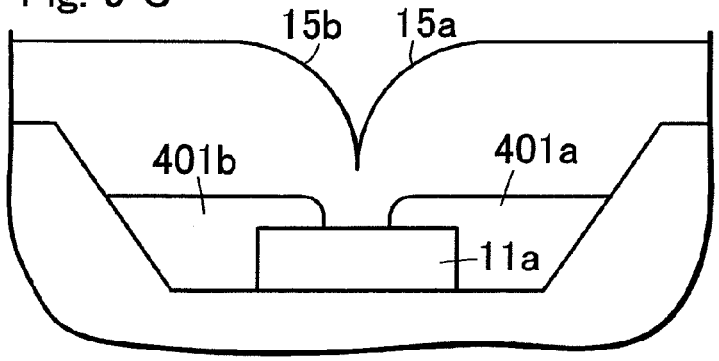
Figure 9:
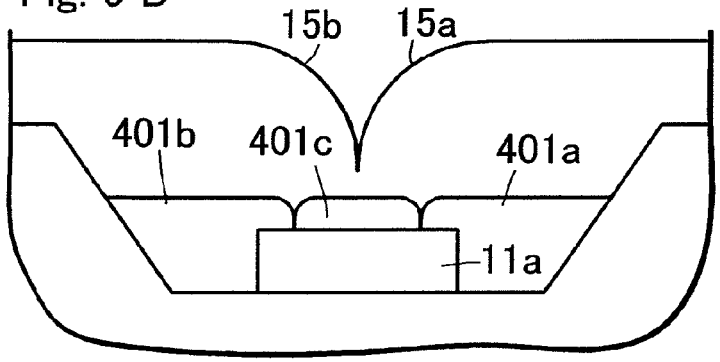

In addition, in FIG. 7 and FIG. 9A, as one example of the third embodiment, an example in which two phosphor layers 401a, 401b having different emission colors are formed on one light emitting element 11a.

The light emitting device of this third embodiment is fabricated as follows.

Figure 8:
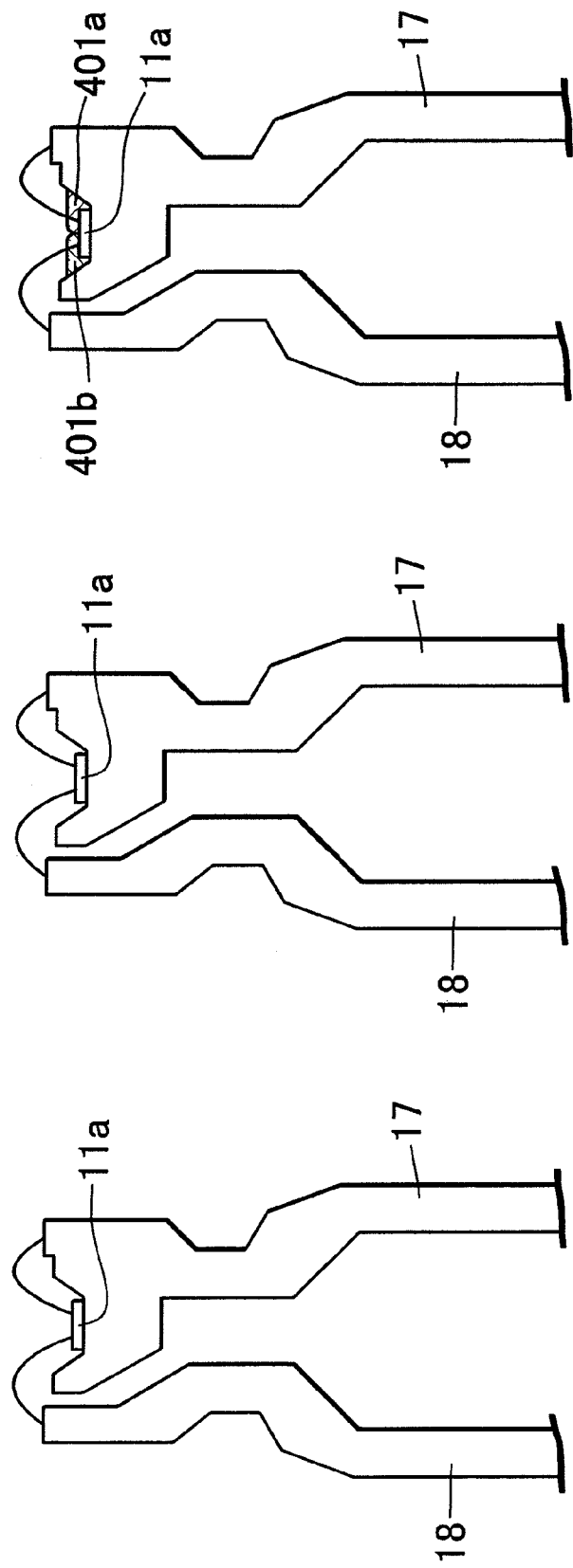
FIG. 8A is a section view of a first step in a production process of the second embodiment.
FIG. 8B is a section view of a second step in a production process of the second embodiment.
FIG. 8C is a section view of a third step in a production process of the second embodiment.

First, as shown in FIG. 8A, the lead 17 and the lead 18 are held with, for example, a jig so that a predetermined relation of their positions is held, and the light emitting elements 11a is fixed to predetermined positions on a bottom surface of the cup 17a by die bonding, and predetermined lines are provided.

Next, a first resin containing a first phosphor and a second resin containing a second phosphor are applied to different positions on the light emitting elements 11 and the first resin and the second resin are cured and thereby, the phosphor layer 401a, 401b are formed.

Then, by the same method as the first embodiment, in a mold 21 in which a heat-curable transmitting resin is filled, the lead 17 and the lead 18 are inserted into the transmitting resin along with holding the predetermined relation of their positions, and the resin is cured and then taken out of the mold 21.

Last, the reflection film is formed on the concave portion.

The phosphor that is available for the light emitting device according to the present invention is possible as long as a light from the light emitting element(s) is converted to a light having a longer wavelength. However, the phosphor having high emission efficiency is preferable, and the inorganic phosphor having a high heat-resistance is more preferable. It is preferable that as the particle diameter of the inorganic phosphor, the central particle diameter is in the range of 6 µm to 50 µm, and more preferably, 15 µm to 30 µm. The phosphor having such a particle diameter has high absorbance and conversion efficiency of lights and its excitation wavelength width is large. The phosphor having a size smaller than 6 µm is relatively easy to form an aggregate, and thickens and is precipitated and therefore, is prone to have bad absorbance and conversion efficiency of lights and also to have a narrow width of excitation wavelength, as well as degrading transmittance of lights.

Hereinafter, modified examples of the second embodiment will be described.

In addition, in the following modified examples, as the reflection surface 15, a curved reflection surface is used. In the present invention, such a reflection surface may be used.

Moreover, in FIGS. 9A to 9D and FIGS. 10A to 10D that are referred to in the following description, the reflection surface is drawn nearer to the emission part than that of it fact so that the relation between the central axis of the reflection surface and the emission part is seen well.

Modified Example 8

In the light emitting device of Modified Example 8, as shown in FIG. 9B, the phosphor layers 401a, 401b are formed so that portions of the different phosphor layers overlap.

By the above described method, the two phosphor layers 401a, 401b are used and thereby, three emission parts having different emission colors are formed.

Modified Example 9

In the light emitting device of Modified Example 9, as shown in FIG. 9C, the phosphor layers 401a, 401b are separated and formed so that portions of emission surfaces of the light emitting element is not covered with the phosphor.

Also, by the above described method, the two phosphor layers 401a, 401b are used and thereby, three emission parts having different emission colors are formed.

Modified Example 10

In the light emitting device of Modified Example 10, as shown in FIG. 9D, as well as the phosphor layers 401a, 401b, a third phosphor layer 401c covering a portion of an emission surface of a light emitting element and having a different emission color is formed.

Also, by the above described method, three emission parts having different emission colors can be formed.

Modified Example 11

Figure 10:
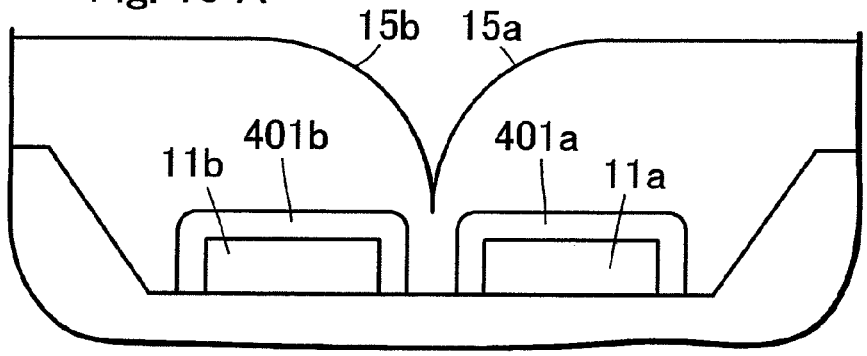
FIG. 10A is a section view showing the light emitting elements in the light emitting device of Modified Example 11 according to the present invention and a structure of their circumstance.
FIG. 10B is a section view showing the light emitting elements in the light emitting device of Modified Example 12 according to the present invention and a structure of their circumstance.
FIG. 10C is a section view showing the light emitting elements in the light emitting device of Modified Example 13 according to the present invention and a structure of their circumstance.
FIG. 10D is a section view showing the light emitting elements in the light emitting device of Modified Example 14 according to the present invention and a structure of their circumstance.
Figure 10:
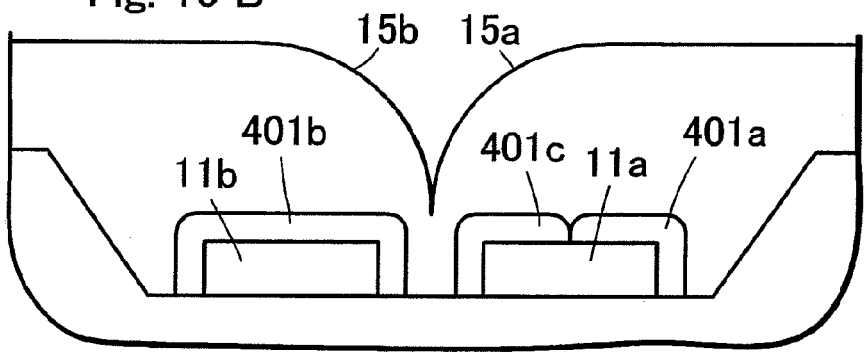
Figure 10:
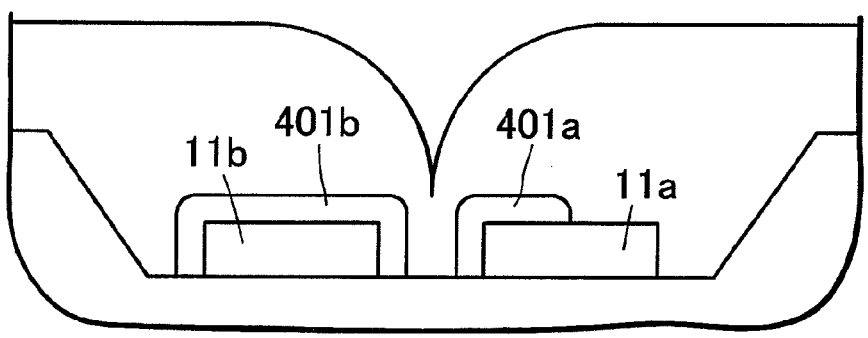
Figure 10:
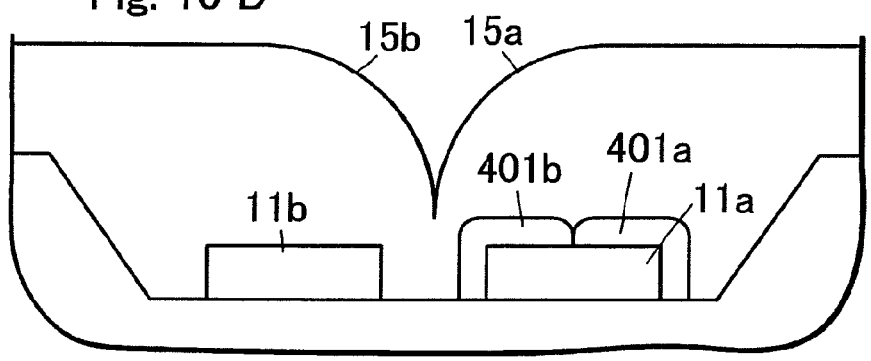

In the light emitting device of Modified Example 11, as shown in FIG. 10A, the phosphor layers 401a, 401b are formed on the light emitting elements 11a, 11b, respectively.

By the above described method, more variation becomes possible according to combination of the light emitting elements 11a, 11b and the phosphor layers 401a, 401b.

Modified Example 12

Moreover, in the light emitting device of Modified Example 12, as shown in FIG. 10B, the phosphor layers 401a, 401c are formed on the light emitting element 11a, and the phosphor layer 401b is formed on the light emitting element 11b.

By the above described method, three emission parts having different emission colors can be formed.

Modified Example 13

Moreover, in the light emitting device of Modified Example 13, as shown in FIG. 10C, the phosphor layers 401a is formed on a portion of the light emitting element 11a, and the phosphor layer 401b is formed on the light emitting element 11b.

Also, by the above described method, three emission parts having different emission colors can be formed.

Modified Example 14

Furthermore, in the light emitting device of Modified Example 13, as shown in FIG. 10D, the phosphor layers 401a is formed on a portion of the light emitting element 11a, and the phosphor layer 401b is formed on the residual portion thereof, and no phosphor layer is formed on the light emitting element 11b.

Also, by the above described method, three emission parts having different emission colors can be formed.

Fourth Embodiment

Figure 11:
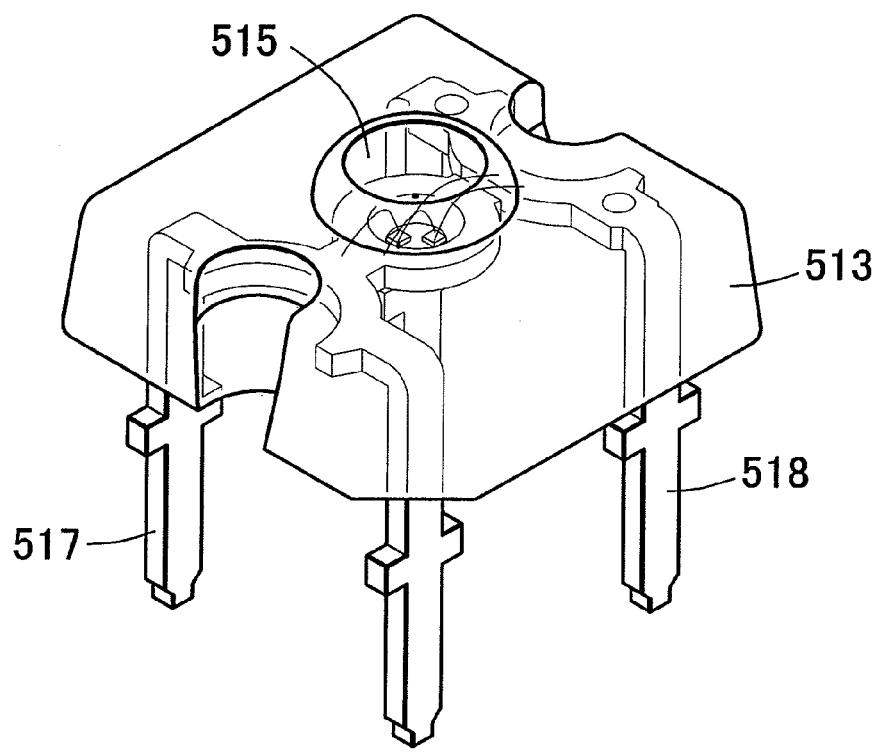
FIG. 11A is a perspective view showing a structure of the light emitting device of the fourth embodiment according to the present invention.
FIG. 11B is a perspective view showing a structure of the lead in the light emitting device of the fourth embodiment.
Figure 11:
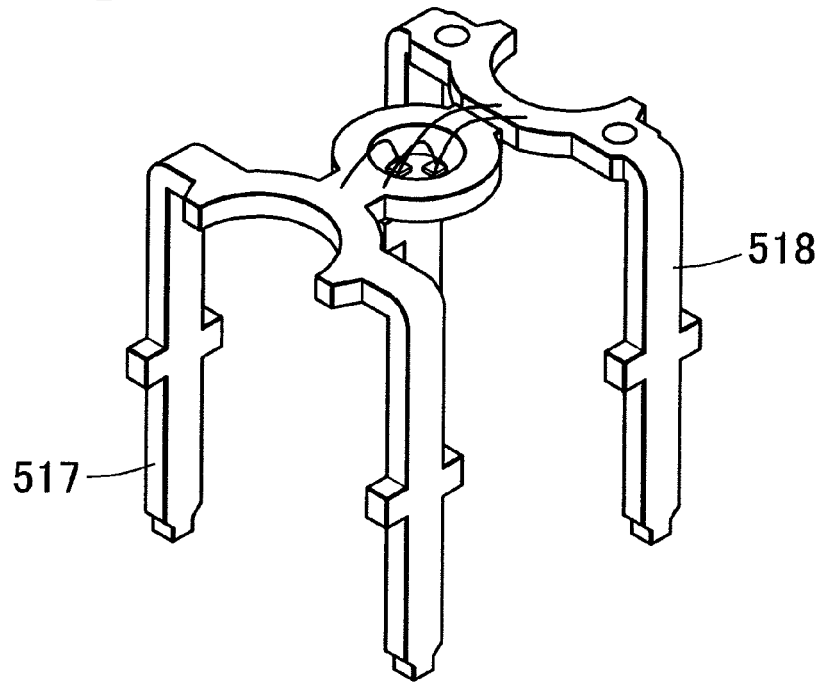

As shown in FIG. 11A and FIG. 11B, in the light emitting device of the fourth embodiment according to the present invention, the shapes of the lead 517 and the lead 518 and the shape of the transmitting resin 513 are different from those of the first to third embodiments.

In particular, in the present fourth embodiment, the light emitting device is constituted so that a convex portion rising on a transmitting resin 513 is formed and a reflection surface 515 is formed on the convex portion and thereby, a light is output mainly from the peripheral surface of the convex portion.

By the above described method, the radiation direction of a light can be controlled by the shape of the peripheral surface of the convex portion (control of directivity), and lights having different colors according to the visual direction can be observed.

In addition, in the light emitting device of the present fourth embodiment, the structures of the first embodiment to 3 and Modified Examples 1 to 14 can be adapted to the structures of the light emitting elements and their circumstance, and also other structures can be adapted thereto.

Moreover, in the light emitting device of the fourth embodiment, a total of four legs that are the leads 517, 518, implementation, stability, ease of handling, and so forth are improved, compared to the other embodiments.

The invention claimed is:
1. A light emitting device comprising:
at least two electrical leads, each provided with an end portion;
an emission source, including a plurality of light emitting elements supported on an end portion of one of the electrical leads, each of the light emitting elements emitting light of a color that is different from the color of light emitted by the others of the plurality of light emitting elements; and
a transmitting resin for transmitting at least parts of individual lights output from each of the plurality of light emitting elements without blending with lights output from the others of the plurality of light emitting elements, the emission source being potted into the transmitting resin together with the end portions, the transmitting resin having a conically shaped reflection surface for reflecting the lights output from the plurality of light emitting elements, at least one of the light emitting elements being located away from a central axis of the conically shaped reflection surface; whereby different colors of lights reflected from the reflection surface can be discerned from different viewing directions; wherein at least one of the light emitting elements is supported on a surface that is angularly disposed with respect to a surface on which another of the light emitting elements is supported; and wherein the end portion that supports the light emitting elements includes stepped surfaces, and each of the stepped surfaces supports a different one of the plurality of light emitting elements.

2. The light emitting device according to claim 1, wherein each of the plurality of light emitting elements is supported in a position that is different from the position of the others of the plurality of light emitting elements.

3. The light emitting device according to claim 1, wherein the conical shape of the reflection surface is a polygonal cone.

4. The light emitting device according to claim 1, wherein the conical shape of the reflection surface is a circular cone.

5. The light emitting device according to claim 1, wherein an outer shape of the transmitting resin is a polygonal prism shape and a central axis of an outer shape of the transmitting resin is generally coincident with a central axis of the conical shape of the reflection surface.

6. The light emitting device according to claim 1, wherein an outer shape of the transmitting resin is a cylindrical column shape and a central axis of the cylindrical column is generally coincident with a central axis of the conical shape of the reflection surface.

7. The light emitting device according to claim 1, wherein a reflection-enhancing member is formed on the reflection surface.

8. The light emitting device according to claim 1, wherein the end portion that supports the light emitting elements is cup-shaped defining a recess formed therein.

9. A light emitting device comprising:
at least two electrical leads, each provided with an end portion;
an emission source, including a plurality of light emitting elements supported on an end portion of one of the electrical leads, each of the light emitting elements emitting light of a color that is different from the color of light emitted by the others of the plurality of light emitting elements; and
a transmitting resin for transmitting at least parts of individual lights output from each of the plurality of light emitting elements without blending with lights output from the others of the plurality of light emitting elements, the emission source being potted into the transmitting resin together with the end portions, the transmitting resin having a conically shaped reflection surface for reflecting the lights output from the plurality of light emitting elements, at least one of the light emitting elements being located away from a central axis of the conically shaped reflection surface; whereby
different colors of lights reflected from the reflection surface can be discerned from different viewing directions; and wherein
the conical shape of the reflection surface is a polygonal cone.

10. The light emitting device according to claim 9, wherein each of the plurality of light emitting elements is supported in a position that is different from the position of the others of the plurality of light emitting elements.

11. The light emitting device according to claim 9, wherein each of the plurality of light emitting elements is supported on an end portion of a single electrical lead, and at least one of the light emitting elements is supported on a surface that is angularly disposed with respect to a surface on which another of the light emitting elements is supported, and the end portion that supports the light emitting elements includes stepped surfaces, and each of the stepped surfaces supports a different one of the plurality of light emitting elements.

12. The light emitting device according to claim 9, wherein an outer shape of the transmitting resin is a cylindrical column shape and a central axis of the cylindrical column is generally coincident with a central axis of the conical shape of the reflection surface.

13. The light emitting device according to claim 9, wherein a reflection-enhancing member is formed on the reflection surface.

14. The light emitting device according to claim 9, wherein the end portion that supports the light emitting elements is cup-shaped defining a recess formed therein.

15. A light emitting device comprising:
at least two electrical leads, each provided with an end portion;
an emission source, including a plurality of light emitting elements supported on an end portion of one of the electrical leads, each of the light emitting elements emitting light of a color that is different from the color of light emitted by the others of the plurality of light emitting elements; and
a transmitting resin for transmitting at least parts of individual lights output from each of the plurality of light emitting elements without blending with lights output from the others of the plurality of light emitting elements, the emission source being potted into the transmitting resin together with the end portions, the transmitting resin having a conically shaped reflection surface for reflecting the lights output from the plurality of light emitting elements, at least one of the light emitting elements being located away from a central axis of the conically shaped reflection surface; whereby
different colors of lights reflected from the reflection surface can be discerned from different viewing directions; and wherein
an outer shape of the transmitting resin is a polygonal prism shape and a central axis of an outer shape of the transmitting resin is generally coincident with a central axis of the conical shape of the reflection surface.

16. The light emitting device according to claim 15, wherein each of the plurality of light emitting elements is supported in a position that is different from the position of the others of the plurality of light emitting elements.

17. The light emitting device according to claim 15, wherein
each of the plurality of light emitting elements is supported on an end portion of a single electrical lead, and at least one of the light emitting elements is supported on a surface that is angularly disposed with respect to a surface on which another of the light emitting elements is supported, and
the end portion that supports the light emitting elements includes stepped surfaces, and each of the stepped surfaces supports a different one of the plurality of light emitting elements.

18. The light emitting device according to claim 15, wherein an outer shape of the transmitting resin is a cylindrical column shape and a central axis of the cylindrical column is generally coincident with a central axis of the conical shape of the reflection surface.

19. The light emitting device according to claim 15, wherein a reflection-enhancing member is formed on the reflection surface.

20. The light emitting device according to claim 15, wherein the end portion that supports the light emitting elements is cup-shaped defining a recess formed therein.

* * * * *